(12) United States Patent
Dijkstra

(10) Patent No.: US 6,411,958 B1
(45) Date of Patent: Jun. 25, 2002

(54) DATA PROCESSING SYSTEM AND METHOD FOR GENERATING A STRUCTURED LISTING OF SYMBOLS

(75) Inventor: Wilco Dijkstra, Cherry Hinton (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/259,339

(22) Filed: Mar. 1, 1999

(51) Int. Cl.$^7$ ................................................ G06F 17/30
(52) U.S. Cl. ...................... 707/101; 707/100; 707/102; 707/103
(58) Field of Search .................. 341/107, 143, 341/148; 707/100, 101, 102, 103; 375/240.18; 348/395.1, 408.1; 704/230

(56) References Cited

U.S. PATENT DOCUMENTS

| | | | | |
|---|---|---|---|---|
| 5,161,224 A | * | 11/1992 | Tsutsumitake | 707/102 |
| 5,694,599 A | * | 12/1997 | Maegawa et al. | 707/100 |
| 5,761,508 A | * | 6/1998 | Okuno | 395/701 |
| 5,953,730 A | * | 9/1999 | Schawer | 707/503 |
| 5,995,963 A | * | 11/1999 | Nanba et al. | 707/6 |
| 6,067,607 A | * | 5/2000 | Maegawa et al. | 711/203 |

OTHER PUBLICATIONS

Roy Hoffman, Data Compression in Digital Systems, Digital Multimedia Standards Series, pp. 53–74, 1996.*
Woo et al., Huffman Trees as a Basis for a Dynamic Mutual Exclusion Algorithm for Distributed Systems, IEEE, pp. 126–133, Jun. 1992.*
Schwarzkopf, Computing Convolutions on Mesh–Like Structures, IEEE, pp. 695–699, Apr. 1993.*
Blostein et al., A Tree Search Algorithm for Target Detection in Image, IEEE, pp. 690–695, Jun. 1988.*
Blostein, Object Boundary Detection in Image Sequences Using Multistage Hypothesis Testing, IEEE, p. 26, Sep. 1989.*
Aho et al., Data Structures and Algorithm, 1983, Addiso–Wesley Publishing Company, pp. 253–292.*
Roy Hoffman, Data Compression in Digital Systems, Digital multimedia Standards Series, 1997, International Thomson Publishing, pp. 53–74.*

* cited by examiner

Primary Examiner—Frantz Coby
(74) Attorney, Agent, or Firm—Nixon & Vanderhye P.C.

(57) ABSTRACT

A data processing system and method are provided for generating a structured listing of symbols from which encoded data values for those symbols can be determined. The data processing system comprises a list generator for generating from an input stream of symbols a first list having a plurality of entries, each entry identifying a symbol in the input stream and the frequency with which that symbol appears. A sorter is then arranged to order the entries in the first list by frequency, and a selector is arranged to select the two symbols having the lowest frequency. A new symbol generator, responsive to the selector, is used to generate a new symbol to represent the two selected symbols, and to allocate the new symbol a frequency based on the two selected symbols. The list generator is also arranged to generate a second list for storage of new symbols generated by the new symbol generator, the list generator being arranged to store the new symbol as an entry in the second list along with an indication of the frequency allocated to the new symbol. Further, the list generator makes unavailable for subsequent steps in the generation of the structured listing the entries for the two symbols selected by the selector. The selector and new symbol generator are arranged to repetitively represent the two symbols having the lowest frequency with a new symbol until only one available entry remains, each new symbol being stored in the second list, and in each iteration the selector being arranged to select the two symbols from all available entries in the first and the second list. Using this technique, the time taken to generate the structured listing increases proportional to N, where N is the number of symbols in the input stream.

19 Claims, 6 Drawing Sheets

LIST 1

| Freq. | Sym. |
|---|---|
| 16 | A |
| 6 | C |
| 5 | B |
| 5 | E |
| 3 | D |

LIST 2

| Freq. | Sym. | |
|---|---|---|
| | | ← L2Start |
| 35 | R | ← L2End |
| 19 | Z | |
| 11 | Y | |
| 8 | X | |

FIG. 2A

| LIST 1 | |
|---|---|
| Freq. | Sym. |
| 16 | A |
| 6 | C |
| 5 | B |
| 5 | E |
| 3 | D |

↑ L1End

| LIST 2 | |
|---|---|
| Freq. | Sym. |
|  |  |
|  |  |
|  |  |
|  |  |
| 8 | X |

↓ L2Start    ↓ L2End

FIG. 2B

| LIST 1 | |
|---|---|
| Freq. | Sym. |
| 16 | A |
| 6 | C |
| 5 | B |
| 5 | E |
| 3 | D |

↑ L1End

| LIST 2 | |
|---|---|
| Freq. | Sym. |
|  |  |
|  |  |
|  |  |
| 11 | Y |
| 8 | X |

↓ L2Start    ↓ L2End

FIG. 2C

| LIST 1 | |
|---|---|
| Freq. | Sym. |
| 16 | A |
| 6 | C |
| 5 | B |
| 5 | E |
| 3 | D |

↑ L1End

| LIST 2 | |
|---|---|
| Freq. | Sym. |
|  |  |
|  |  |
| 19 | Z |
| 11 | Y |
| 8 | X |

↓ L2Start    ↓ L2End

FIG. 2D

| LIST 1 | |
|---|---|
| Freq. | Sym. |
| 16 | A |
| 6 | C |
| 5 | B |
| 5 | E |
| 3 | D |

| LIST 2 | |
|---|---|
| Freq. | Sym. |
|  |  |
| 35 | R |
| 19 | Z |
| 11 | Y |
| 8 | X |

↓ L2Start    ↓ L2End

A = 0
B = 100
C = 101
D = 110
E = 111

LIST 1

| Freq. | Sym. |
|---|---|
| 16 | A |
| 6 | C |
| 5 | B |
| 5 | E |
| 3 | D |

LIST 2

| Freq. | Sym. | Child1 | Child2 |
|---|---|---|---|
|  | R | A | Z |
| 35 | Z | Y | X |
| 19 | Y | B | C |
| 11 | X | D | E |
| 8 |  |  |  |

DATA PROCESSING SYSTEM AND METHOD FOR GENERATING A STRUCTURED LISTING OF SYMBOLS

BACKGROUND OF THE INVENTION

1. Field of the Invention

The present invention relates to a data processing system and method for generating a structured listing of symbols from which encoded data values for those symbols can be determined.

2. Description of the Prior Art

It is often desirable to compress a stream of data at some point during the processing of that data stream. Generally the data stream can be considered as comprising a sequence of symbols, where a symbol is a predefined data element that can be individually encoded during the compression of the data stream. For example, if the data stream represents a text file, then the data representing each individual ASCII character may be considered to be a symbol. Similarly, if the data stream represents an image, then the data representing individual pixels may be considered to be a symbol.

When compressing such a data stream, it is first necessary to generate a structured listing of the symbols from which encoded data values for those symbols can be determined. This structured listing may take a variety of forms, for example a look-up table identifying the encoded data value for each symbol, or a tree structure with the set of symbols forming the leaves. One example of a compression technique which may be applied is the Huffmann compression technique. When performing Huffmann compression, it is necessary to generate a structured listing of symbols in the form of a Huffmann tree, the Huffmann tree enabling encoded data values to be obtained for each symbol.

Considering the example of Huffmann compression, this basically consists of three steps, namely:

1 Counting symbol frequencies in a data stream;
2 Generating the Huffmann tree based on the frequency information for each symbol; and
3 Encoding symbols using the Huffmann tree.

The first and last steps are well understood, and optimal implementations have existed for some time. However, the second step has a significant impact on the efficiency of the Huffmann compression technique, since the algorithms used to build the Huffmann tree are typically relatively slow. For example, often an algorithm having a complexity of order $N^2$ (referred to as a $O(N^2)$ algorithm) is used to build the Huffmann tree, where N is the number of symbols. Hence, as N becomes larger, the time taken to build the Huffmann tree increases proportional to $N^2$. More advanced algorithms do exist which use a priority queue in order to achieve lower build time of $O(N \log N)$.

However, it is still desirable to further decrease the time taken to generate the structured listing of symbols, for example the Huffmann tree in the case of Huffmann compression. It will be appreciated that better compression will be achieved if the structured listing of symbols is generated dynamically based on the particular data stream to be compressed. However, the benefits of doing this have to be weighed up against the overheads involved in generating the structured listing of symbols dynamically. Hence, in certain implementations where the overhead in generating a dynamic structured listing of symbols is considered too great, a structured listing of symbols is instead generated on the basis of a sample data stream, and compression of subsequent data streams is then obtained using that structured listing of symbols. Clearly if the structured listing of symbols could be generated more efficiently, then this would increase the number of implementations in which it would be acceptable to generate the structured listing dynamically based on the actual data to be compressed, thereby enabling significantly improved compression to be obtained.

Accordingly, it is an object of the present invention to provide an improved technique for generating a structured listing of symbols from which encoded data values for those symbols can be determined.

SUMMARY OF THE INVENTION

Viewed from a first aspect, the present invention provides a method of generating a structured listing of symbols from which encoded data values for those symbols can be determined, the method comprising the steps of: (a) for an input stream of symbols, generating a first list having a plurality of entries, each entry identifying a symbol in the input stream and the frequency with which that symbol appears; (b) ordering the entries in the first list by frequency; (c) selecting the two symbols having the lowest frequency; (d) generating a new symbol to represent the two selected symbols, and allocating the new symbol a frequency based on the two selected symbols; (e) storing the new symbol as an entry in a second list along with an indication of the frequency allocated to the new symbol; (f) arranging for the entries for the two symbols selected at said step (c) to be unavailable for subsequent steps in the generation of the structured listing; and (g) repeating the steps (c) to (f) until only one available entry remains, in each iteration the two symbols selected at said step (c) being chosen from all available entries in the first and the second list.

In accordance with the present invention, a first list is generated having entries identifying symbols and the frequency with which those symbols appear, the entries in the list being ordered by frequency. Then the two symbols having the lowest frequency are selected, and a new symbol is generated to represent those symbols, the new symbol being allocated a frequency based on the two selected symbols. Generally the frequency assigned to the new symbol will be equal to the sum of the frequencies of the two selected symbols represented by the new symbol.

Then, in accordance with the invention, the new symbol is stored as an entry in a second list along with an indication of the frequency allocated to that symbol, and the entries for the two symbols that were selected to be represented by that new symbol are then deemed unavailable for subsequent steps in the generation of the structured listing. This process of selecting the two symbols with the lowest frequency, and replacing them with a new symbol stored in the second list is repeated until only one available entry remains. In each iteration, the two symbols with the lowest frequency are chosen from all available entries in the first and the second list.

It will be appreciated by those skilled in the art that whilst the first and second lists may be provided separately, they could be provided by a single list logically partitioned to provide the first and second lists.

In accordance with the above approach, it will be appreciated that the original set of symbols in the input stream need only be ordered once, since the entries in the first list then remain frequency ordered throughout the generation of the structured listing. There are a number of known $O(N)$ sorting algorithms that can be used to perform this initial ordering. Further, in accordance with the present invention, all of the new symbols generated are placed in a separate list, and since each new symbol generated will have a frequency greater than any of the new symbols previously generated (since in each iteration the two symbols having the lowest frequency will have larger frequencies than the two symbols selected during the previous iteration), then it can be seen that the entries in the second list can be readily maintained in frequency order.

Given that the frequency ordering of both lists is readily maintained, the number of entries that need to be reviewed in order to find the symbol having the lowest frequency is independent of the total number of symbols N, and in fact the smallest symbol can be selected in O(1) time, i.e. in a single time step.

If there are N symbols initially, then since each iteration removes two symbols, and inserts one new symbol, the method of the invention takes N iterations to complete. Since selecting the two smallest symbols takes O(1) time, and inserting the new symbol takes O(1) time, it can be seen that in accordance with the present invention, the structured listing of symbols can be generated in O(N) time, and hence as N becomes larger, the time taken to generate the structured listing only increases proportional to N.

In preferred embodiments, a first end of the first list contains the entry for the symbol in the input stream with the lowest frequency, a first end of the second list contains the entry for the new symbol in the second list with the lowest frequency, and at said step (c) the two symbols with the lowest frequency are selected from the available entries nearest the first ends of the first and second lists.

Preferably, the second list is frequency ordered by arranging that each new symbol added to the second list is stored in an entry further from the first end of the second list than any other entries in the second list. As mentioned earlier, this enables the second list to trivially remain sorted, since the sum of the frequencies of the two smaller symbols monotonically increases during each iteration, and hence each new symbol generated will have a frequency higher than any new symbol generated in previous iterations.

In preferred embodiments, a series of pointers are used to assist in the selection of the symbols having the lowest frequency. In particular, a first pointer is preferably arranged to point to the available entry nearest the first end of the first list, and a second pointer is arranged to point to the available entry nearest the first end of the second list, a symbol being selected at said step (c) by comparing the frequencies of the symbols identified by the first and second pointers.

Further, in preferred embodiments, a third pointer is arranged to point to a location in the second list at which an entry for the next new symbol is to be stored, and if the second and third pointers point to the same location in the second list, then a symbol is selected at said step (c) by selecting the symbol identified by the first pointer. During the first iteration of the method, it will be clear that there are no entries in the second list, and accordingly the second and third pointers will point to the same location during this first iteration. Using this preferred approach, it is clear that the symbols selected at said step (c) during the first iteration can merely be selected by selecting the symbols identified by the first pointer.

Assuming the first list contains N symbols, then in preferred embodiments a fourth pointer is arranged to point to a location displaced by N entries from the entry initially pointed to by the first pointer, wherein when the first pointer and the fourth pointer point to the same location, there are no more available entries in the first list, and any further symbols selected at said step (c) are selected from the second list. This approach ensures that when there are no more available entries in the first list, then the process merely continues by selecting available symbols from the second list until such time as there is only a single available entry left.

It will be appreciated that there are a number of ways in which it can be determined when there is only a single available entry left in the first and second lists. However, in preferred embodiments, where the first list contains N symbols the method further comprises the steps of: initialising a count value to N; during each iteration of said steps (c) to (f), decrementing the count value by 1; and arranging for the final iteration of said steps (c) to (f) to be the iteration during which the count value is decremented to be equal to 1.

The structured listing of symbols may take a variety of forms. However, in preferred embodiments the structured listing represents a Huffmann tree, and the encoded data values for each symbol are determined from the Huffmann tree. Huffmann compression is a commonly used compression technique, and the technique of the present invention provides significant efficiency improvements in the generation of the Huffmann tree when compared with algorithms typically used in the prior art.

It will be apparent that when using the structured listing of symbols to determine encoded data values, it will typically be necessary to have a record of the two symbols represented by any particular new symbol. Hence, in preferred embodiments, each entry in the second list includes two child fields identifying the two symbols represented by the new symbol stored in that entry.

Viewed from a second aspect, the present invention provides a data processing system for generating a structured listing of symbols from which encoded data values for those symbols can be determined, the data processing system comprising: a list generator for generating from an input stream of symbols a first list having a plurality of entries, each entry identifying a symbol in the input stream and the frequency with which that symbol appears; a sorter for ordering the entries in the first list by frequency; a selector for selecting the two symbols having the lowest frequency; a new symbol generator, responsive to the selector, to generate a new symbol to represent the two selected symbols, and to allocate the new symbol a frequency based on the two selected symbols; the list generator being arranged to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols from all available entries in the first and the second list.

Viewed from a third aspect, the present invention provides an encoder for generating a structured listing of symbols from which encoded data values for those symbols can be determined, the encoder comprising: a list generator configured in operation to generate from an input stream of symbols a first list having a plurality of entries, each entry identifying a symbol in the input stream and the frequency with which that symbol appears; a sorter configured in operation to order the entries in the first list by frequency; a selector configured in operation to select the two symbols having the lowest frequency; a new symbol generator configured to be responsive to the selector to generate a new symbol to represent the two selected symbols, and to allocate the new symbol a frequency based on the two selected symbols; the list generator further being configured in operation to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols from all available entries in the first and the second list.

Viewed from a fourth aspect, the present invention provides a computer program product on a computer readable medium for operating a data processing system to generate a structured listing of symbols from which encoded data values for those symbols can be determined, the computer program product comprising: a list generator configured in operation to generate from an input stream of symbols a first list having a plurality of entries, each entry identifying a symbol in the input stream and the frequency with which that symbol appears; a sorter configured in operation to order the entries in the first list by frequency; a selector configured in operation to select the two symbols having the lowest frequency; a new symbol generator configured in operation to be responsive to the selector to generate a new symbol to represent the two selected symbols, and to allocate the new symbol a frequency based on the two selected symbols; the list generator further being configured in operation to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols from all available entries in the first and the second list.

BRIEF DESCRIPTION OF THE DRAWINGS

The present invention will be described further, by way of example only, with reference to a preferred embodiment thereof as illustrated in the accompanying drawings, in which:

FIGS. 2A to 2D illustrate the contents of the first and second lists at various stages during the generation of the structured listing;

DESCRIPTION OF A PREFERRED EMBODIMENT

The preferred embodiment of the present invention will be discussed in the context of Huffmann compression, and in particular the generation of a structured listing of symbols representing a Huffmann tree.

A Huffmann tree is built from a set of symbols, each with a frequency. A typical Huffmann algorithm works by finding and removing the two symbols with the smallest frequency. A parent node is then created whose frequency is equal to the sum of those two symbols, those symbols being referred to as the children of the parent node. The parent node is then added to the set of symbols, the parent node being allocated a unique symbol number. This process is repeated until only one symbol remains, this symbol forming the root of the Huffmann tree. The set of parent nodes created are generally referred to as a internal nodes as they form the branches of the Huffmann tree, whilst the original set of symbols form the leaves.

Whilst the data stream to be compressed only needs to be scanned once to derive the set of symbols, typical prior art algorithms have to rescan the entire set of symbols during each iteration of the process, since during each iteration a new parent node is added to the total set of symbols. Further, if the set of symbols is frequency ordered using a sorting algorithm, thereby avoiding the need to scan the entire set of symbols to determine the two symbols with the lowest frequencies, it is clear that the addition of a parent node to the set of symbols then results in the requirement for the set of symbols to be reordered during each iteration. Thus it can be seen that the generation of the Huffmann tree takes a significant time, and indeed most algorithms used to generate Huffmann trees have $O(N^2)$ time performance, and hence the time taken to generate the Huffmann tree increases proportional to $N^2$, where N is the total number of symbols. As mentioned earlier, some more advanced algorithms exist which use a priority queue in order to build the Huffmann tree in $O(N \log N)$ time, but still it is clear that a significant time is taken to build the Huffmann tree, thereby adversely affecting the efficiency of the Huffmann compression technique.

The technique of preferred embodiments used to reduce the time taken to generate the Huffmann tree will now be described with reference to FIGS. 1 to 6.

Figure 1:
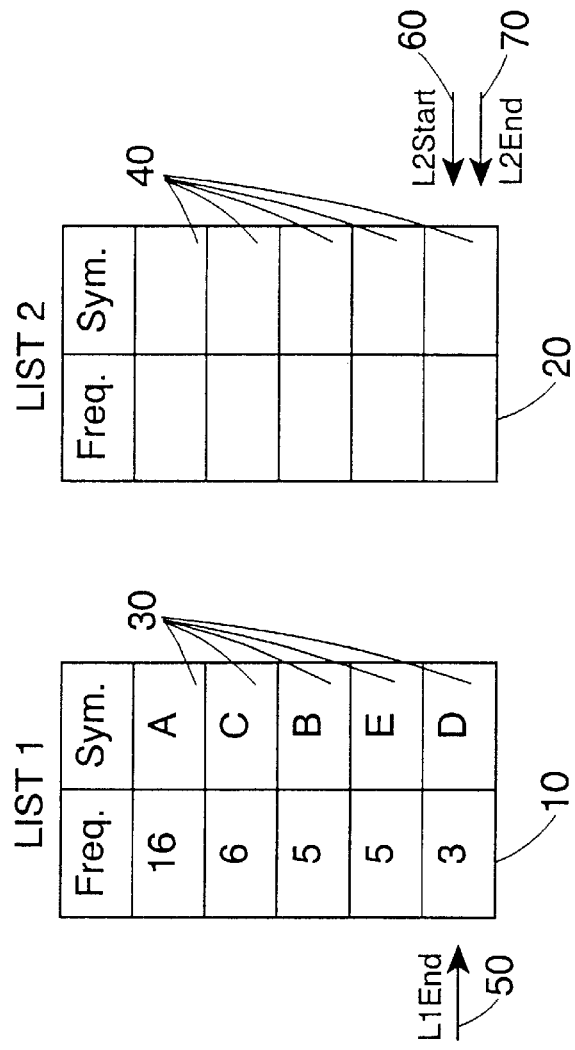
FIG. 1 illustrates a sample file containing a stream of symbols, and the initial contents of the first and second lists based on that sample file.

FIG. 1 illustrates a sample file containing a stream of symbols to be encoded.

In this example, the symbols are ASCII characters. In the standard ASCII encoding each character is binary encoded by 8 bits, and accordingly 256 possible characters can be encoded. Hence, although in FIG. 1 each character is identified schematically, it will be appreciated that the actual file would comprise a sequence of 1s and 0s, with 8 bits being allocated to each ASCII character.

The technique used in preferred embodiments to generate the structured listing of symbols from this sample file will now be described with reference to FIGS. 1 and 2, and the flow diagram of FIGS. 3 and 4. Firstly, with reference to FIG. 3, the file is scanned at step 300 to create a frequency list, this list being the first list 10 illustrated in FIG. 1. This list contains an entry 30 for each symbol in the file, the entry for a particular symbol also identifying the frequency with which that symbol appears in the file.

Then, at step 310, the entries 30 in the first list 10 are sorted by frequency such that the entry at a first end of the list 10 contains the symbol with the lowest frequency (here symbol D which has a frequency of 3), and subsequent entries then include symbols having higher and higher frequencies, the final entry containing the symbol with the highest frequency (here symbol A which has a frequency of 16). It will be appreciated by those skilled in the art that a number of standard sorting algorithms having O(N) time performance can be used at step 310, for example counting sort or Radix sort algorithms.

At step 320, the values of a number of variables are then defined. In particular, a new symbol, $S_{new}$, is set to have the value N, where N is the total number of symbols in the file, here five. Further, a count value, Count, is set equal to N. Finally, a number of pointers are set. Firstly, having regard to the first list 10, a pointer L1End 50 is set equal to N, and hence points to the fifth entry in the first list 10, as illustrated in FIG. 1. Further, a pointer L1Start is set to a value 0. Similarly, for a second list 20, which initially has a plurality of locations 40 for receiving symbol entries, but does not actually contain any symbols, pointers L2Start 60 and L2End 70 are set equal to N, and hence point to the bottom of the second list 20 as illustrated in FIG. 1.

With these values now set, the process proceeds to step 330 where it is determined whether Count is greater than 1. Since Count has been set equal to N, i.e. 5 in the illustrated example, then clearly Count will be greater than 1, and the process will proceed to step 350, where the count will be decremented by 1. The process then proceeds to step 360, where the smallest symbol is selected, after which the process proceeds to step 370 where the next smallest symbol is selected, these two smallest symbols being referred to as S1 and S2. The process actually performed at steps 360 and 370 will now be described with reference to FIG. 4.

Figure 4:
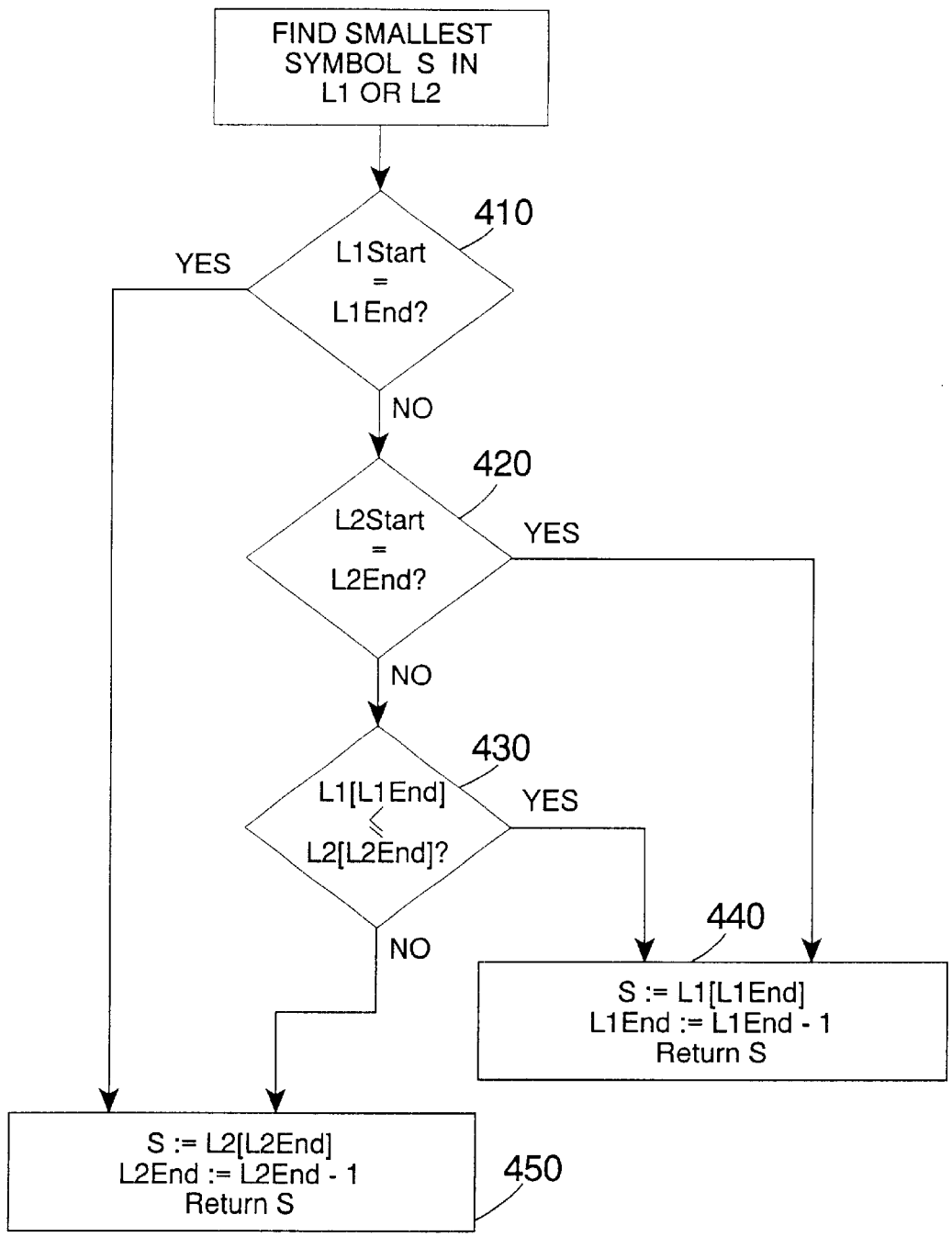

The process illustrated in FIG. 4 is used to identify the smallest symbol in the first or second lists 10, 20. Firstly, at step 410 it is determined whether L1Start is equal to L1End. Clearly on the first iteration this will not be the case, and so the process will proceed to step 420, where it is determined whether L2Start equals L2End. On the first iteration, as is clear from FIG. 1, this is the case, and so the process proceeds to step 440, where the smallest symbol S is determined to be the symbol in list 1 pointed to by the pointer L1End. Hence, having regard to the sample in FIG. 1, the smallest symbol S is determined to be symbol D. The pointer L1End is then decremented by 1, and the smallest symbol S is returned from this process. Referring to step 360, it can be seen that this smallest symbol is identified as S1.

The process in FIG. 4 is then repeated at step 370, and given that L2Start still equals L2End, it can be seen that the process proceeds to step 440, where the smallest symbol is now identified to be symbol E since L1End now points to the entry containing symbol E.

The process then proceeds to step 380, where $S_{new}$ is incremented by 1 and the frequency of $S_{new}$ is determined to be equal to the frequency of S1 plus the frequency of S2. Further, it is identified that child 1 of $S_{new}$ is equal to S1 and child 2 of $S_{new}$ is equal to S2, this information being required later for the Huffmann tree. Then, an entry for $S_{new}$ is added to the second list 20 at the location pointed to by L2Start, and L2Start is then decremented by 1. The contents of the first and second lists 10 and 20, along with the locations of the pointers, at this stage in the process are illustrated in FIG. 2A. For the sake of illustration, the new symbol has been indicated by the letter X, and it can be seen that this new symbol has a frequency of 8, this being the sum of the frequencies of the letters D and E, which are the children of symbol X.

The process then returns to step 330 where it is again determined whether the count is greater than 1. Again, having regard to the illustrated example it is clear that the count will still be greater than 1 on this iteration, and so the process proceeds down the path of steps 350, 360, 370 and 380. Having particular regard to FIG. 4, which illustrates the processes performed at steps 360 and 370, it can be seen from FIG. 2A that L1 Start does not equal L1End and L2Start does not equal L2End. Hence, the process proceeds to step 430, where it is determined whether the entry in the first list pointed to by L1End is less than the entry in the second list pointed to by L2End.

Having regard to FIG. 2A, it can be seen that this is the case, and accordingly the smallest symbol S is determined at step 440 to be the entry in list 1 pointed to by L1End, namely symbol B. L1End is then decremented by 1, and the symbol S is returned, at step 360 this symbol being allocated as S1. This process is then repeated to find S2 at step 370, and again it can be seen that at step 430, the process will branch to step 440 in order to identify the symbol C as the smallest symbol. Accordingly, at step 380, a new symbol $S_{new}$ will be generated having a frequency equal to the frequency of B plus the frequency of C, and this new symbol will be stored in the second list 20 at the location pointed to by L2Start. L2Start will then be decremented by 1. FIG. 2B illustrates the contents of the first and second lists at this stage, along with the locations of the pointers.

The process is then repeated, and it can be seen from FIG. 4 in association with FIG. 2B that at step 430, the process will branch to step 450, since the entry in the second list pointed to by L2End is less than the entry in the first list pointed to by L1End. Accordingly, at step 450, symbol X will be identified as the smallest symbol S and will be allocated as S1 in step 360. Similarly, at step 370, symbol Y will be allocated as S2. At step 380, a new symbol will be created having a frequency equal to the frequency of X plus the frequency of Y, and this new symbol will then be added to the second list 20. The state of the two lists, and the location of the pointers, at this stage in the process, are illustrated in FIG. 2C.

On the next iteration, the count will be equal to two, and hence at step 350, the count will be decremented to 1. Having regard to FIG. 2C, it will be clear that at step 360 the process in FIG. 4 will branch from step 430 to step 440, to identify symbol A as the smallest symbol, this being allocated as S1 at step 360. It will be noted that at step 440, L1End is also decremented by 1, and will hence now equal 0. Accordingly, when executing step 370, it will be determined at step 410 that L1Start equals L1End, and hence the process will branch to step 450, where symbol Z will be identified as the smallest symbol, this being allocated as S2 at step 370. Accordingly a new symbol will be generated at step 380 having a frequency equal to the frequency of A plus the frequency of Z, and this new symbol will then be stored in the second list at the location pointed to by L2Start, L2Start then being decremented by 1. The contents of the two lists, along with the location of the pointers, at this stage in the process, are illustrated in FIG. 2D.

As mentioned earlier, during this last iteration, Count was decremented to 1 at step 350. Hence, on the next iteration, it will be determined at step 330 that the count is not greater than 1, and the process will branch to step 340. At step 340 it is indicated that the entry in list 2 pointed to by L2Start +1 is the root of the Huffmann tree, i.e. symbol R illustrated in FIG. 2D. At this point the process is now complete.

Figures 5A, 5B:
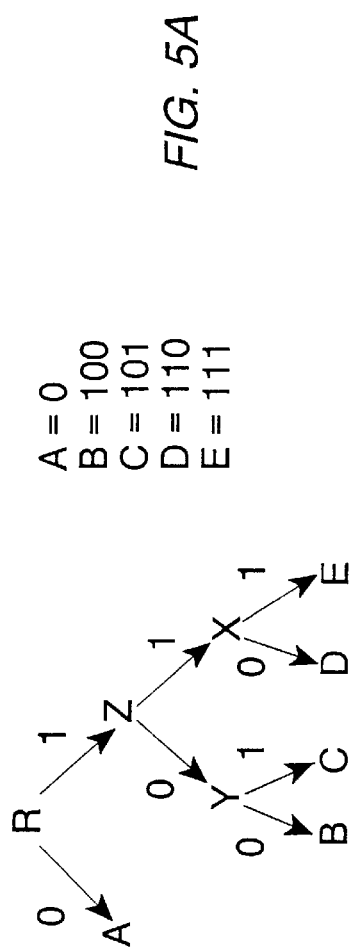
FIG. 5A illustrates the Huffmann tree represented by the final contents of the first and second lists.
FIG. 5B illustrates in more detail the final contents of the first and second lists.

FIG. 5A illustrates the Huffmann tree represented by the contents of the first and second lists in FIG. 2D. As indicated in box 380 of FIG. 3, for each new symbol generated, two fields "child 1" and "child 2" are also generated. In preferred embodiments, each entry in List 2 includes two additional fields to store the values of child 1 and child 2 determined at step 380. FIG. 5B shows the contents of list 1 and list 2 as illustrated in FIG. 2D, but includes the additional two fields per entry in list 2 to identify the children of each new symbol stored in list 2. It will be appreciated from FIG. 5B that the Huffmann tree illustrated in FIG. 5A is readily derivable from the contents of the two lists. Assuming that a branch to the left is represented by a 0, and a branch to the right is indicated by a 1, it can be seen from FIG. 5A that the character A can be encoded by the logic value 0, the character B can be encoded by the logic value 100, the character C can be encoded by the value 101, the character D can be encoded by the value 110, and the character E can be encoded by the value 111. Given that in the standard ASCII encoding, each character is represented by 8 bits, it can be seen that the Huffmann encoding provides a significant compression of the raw ASCII data.

Figure 3:
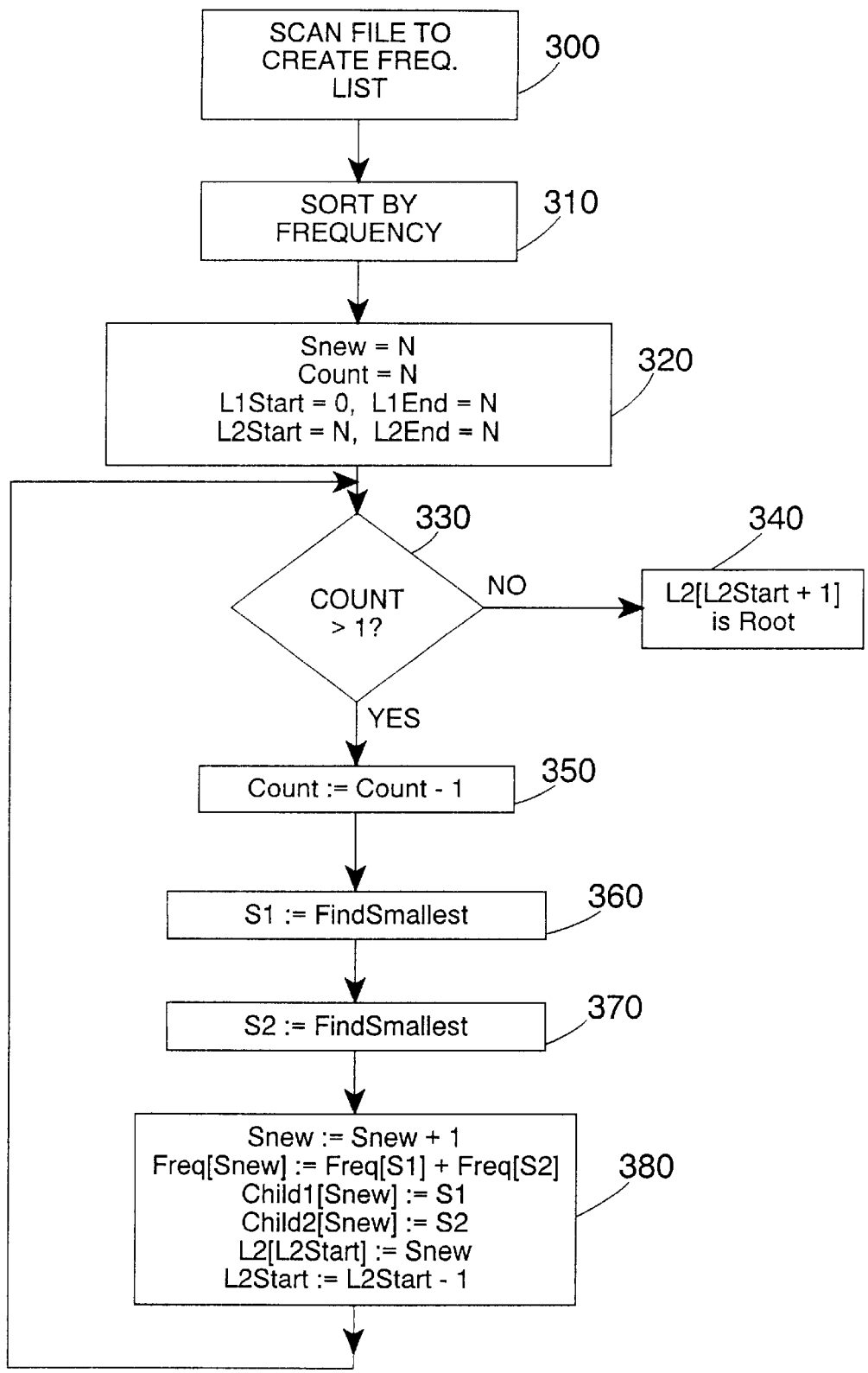
FIGS. 3 and 4 are flow diagrams illustrating the process employed in preferred embodiments of the present invention to generate the structured listing of symbols.

Having regards to the process illustrated in FIGS. 3 and 4, since there are N symbols initially, and each step removes 2 symbols, and inserts 1 new symbol, the algorithm takes N steps to complete. Further, since selecting the two smallest nodes from both lists take O(1) time, and inserting the new node takes O(1) time, the total time taken for building the Huffmann tree can be seen to take O(N) time, i.e. the time taken to build the Huffmann tree increases proportional to N.

Figure 6:
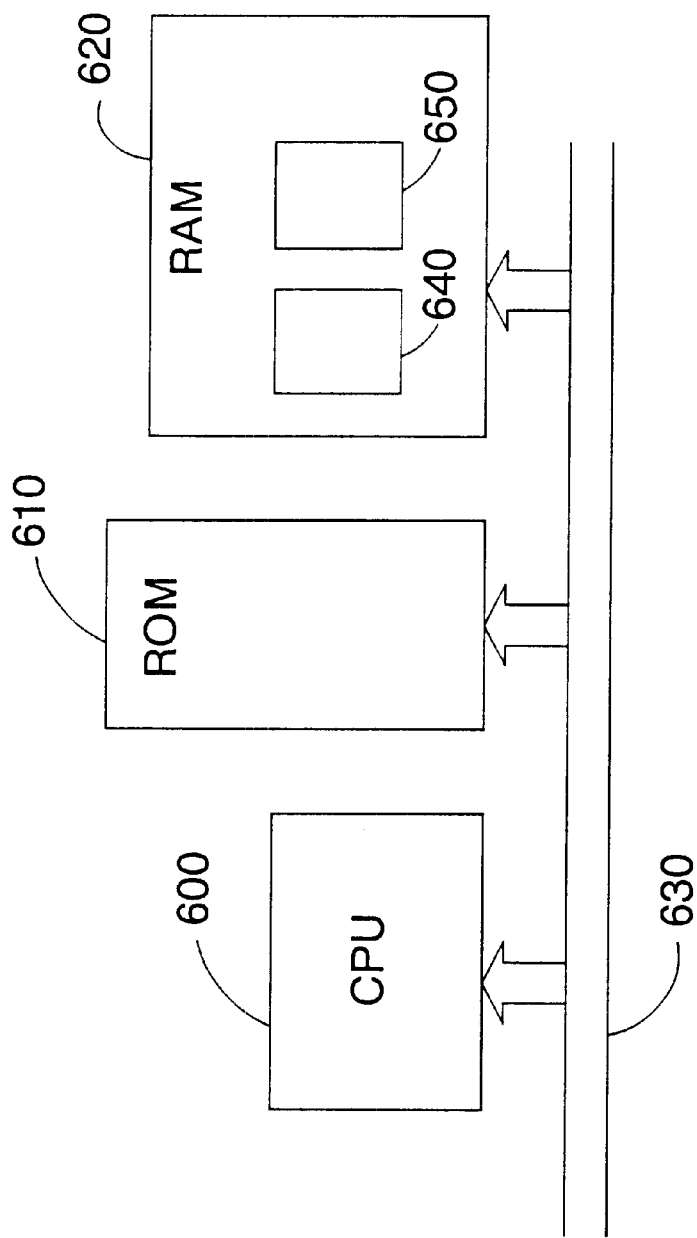
FIG. 6 illustrates a general purpose data processing system for performing the techniques described in relation to FIGS. 1 to 5.

FIG. 6 illustrates a typical data processing system that may be used to implement the techniques described above. A common bus 630 links a central processing unit 600, a random access memory 620 and a read only memory 610.

In operation, software stored within the read only memory 610 or random access memory 620 may be executed by the central processing unit 600 to carry out the techniques described above. The system illustrated in FIG. 6 operates to perform the role of the various logic elements previously described.

The first and second lists generated by the above described techniques would typically be stored in the RAM 620, and are illustrated schematically by elements 640 and 650 in FIG. 6.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. In a computer implemented method of encoding symbols, a method of generating a structured listing of said symbols, the generating method comprising the steps of:

(a) for an input stream of symbols, generating a first list having a plurality of entries, each entry identifying a symbol in the input stream and the frequency with which that symbol appears;

(b) ordering the entries in the first list by frequency;

(c) selecting the two symbols having the lowest frequency;

(d) generating a new symbol to represent the two selected symbols, and allocating the new symbol a frequency based on the two selected symbols;

(e) storing the new symbol as an entry in a second list along with an indication of the frequency allocated to the new symbol;

(f) arranging for the entries for the two symbols selected at said step (c) to be unavailable for subsequent steps in the generation of the structured listing; and (g) repeating the steps (c) to (f) until only one available entry remains, in each iteration the two symbols selected at said step (c) being chosen from all available entries in the first and the second list.

2. A generating method as claimed in claim 1, wherein a first end of the first list contains the entry for the symbol in the input stream with the lowest frequency, a first end of the second list contains the entry for the new symbol in the second list with the lowest frequency, and at said step (c) the two symbols with the lowest frequency are selected from the available entries nearest the first ends of the first and second lists.

3. A generating method as claimed in claim 1, wherein the second list is frequency ordered by arranging that each new symbol added to the second list is stored in an entry further from the first end of the second list than any other entries in the second list.

4. A generating method as claimed in claim 1, wherein a first pointer is arranged to point to the available entry nearest the first end of the first list, and a second pointer is arranged to point to the available entry nearest the first end of the second list, a symbol being selected at said step (c) by comparing the frequencies of the symbols identified by the first and second pointers.

5. A generating method as claimed in claim 4, wherein a third pointer is arranged to point to a location in the second list at which an entry for the next new symbol is to be stored, and if the second and third pointers point to the same location in the second list, then a symbol is selected at said step (c) by selecting the symbol identified by the first pointer.

6. A generating method as claimed in claim 4, wherein the first list contains N symbols, and a fourth pointer is arranged to point to a location displaced by N entries from the entry initially pointed to by the first pointer, wherein when the first pointer and the fourth pointer point to the same location, there are no more available entries in the first list, and any further symbols selected at said step (c) are selected from the second list.

7. A generating method as claimed in claim 1, wherein the first list contains N symbols, and the method further comprises the steps of:

initialising a count value to N;

during each iteration of said steps (c) to (f), decrementing the count value by 1; and arranging for the final iteration of said steps (c) to (f) to be the iteration during which the count value is decremented to be equal to 1.

8. A generating method as claimed in claim 1, wherein the structured listing represents a Huffmann tree, and the encoded data values for each symbol are determined from the Huffmann tree.

9. A generating method as claimed in claim 1, wherein each entry in the second list includes two child fields identifying the two symbols represented by the new symbol stored in that entry.

10. A data processing system for encoding symbols including generating a structured listing of symbols, the data processing system comprising:

a list generator for generating from an input stream of symbols a first list having a plurality of entries, each entry identifying a symbol in the input stream and the frequency with which that symbol appears;

a sorter for ordering the entries in the first list by frequency;

a selector for selecting the two symbols having the lowest frequency;

a new symbol generator, responsive to the selector, to generate a new symbol to represent the two selected symbols, and to allocate the new symbol a frequency based on the two selected symbols;

the list generator being arranged to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols form all available entries in the first and the second list.

11. A data processing system as claimed in claim 10, wherein a first end of the first list contains the entry for the symbol in the input stream with the lowest frequency, a first end of the second list contains the entry for the new symbol in the second list with the lowest frequency, and the selector is arranged to select the two symbols with the lowest frequency from the available entries nearest the first ends of the first and second lists.

12. A data processing system as claimed in claim 10, wherein the second list is frequency ordered by arranging that each new symbol added to the second list is stored in an entry further from the first end of the second list than any other entries in the second list.

13. A data processing system as claimed in claim 10, wherein the list generator has a first pointer arranged to point to the available entry nearest the first end of the first list, and a second pointer arranged to point to the available entry nearest the first end of the second list, a symbol being selected by the selector by comparing the frequencies of the symbols identified by the first and second pointers.

14. A data processing system as claimed in claim 13, wherein the list generator has a third pointer arranged to point to a location in the second list at which an entry for the next new symbol is to be stored, and if the second and third pointers point to the same location in the second list, then the selector is arranged to select a symbol by selecting the symbol identified by the first pointer.

15. A data processing system as claimed in claim 13, wherein the first list contains N symbols, and the list generator has a fourth pointer arranged to point to a location displaced by N entries from the entry initially pointed to by the first pointer, wherein when the first pointer and the fourth pointer point to the same location, there are no more available entries in the first list, and any further symbols selected by the selector are selected from the second list.

16. A data processing system as claimed in claim 10, wherein the structured listing represents a Huffmann tree, and the encoded data values for each symbol are determined from the Huffmann tree.

17. A data processing system as claimed in claim 10, wherein each entry in the second list includes two child fields identifying the two symbols represented by the new symbol stored in that entry.

18. An encoder for generating a structured listing of symbols from which encoded; data values for those symbols can be determined, the encoder comprising:

a list generator configured in operation to generate from an input stream of symbols a first list having a plurality of entries, each entry identifying a symbol in the input stream and the frequency with which that symbol appears;

a sorter configured in operation to order the entries in the first list by frequency;

a selector configured in operation to select the two symbols having the lowest frequency;

a new symbol generator configured to be responsive to the selector to generate a new symbol to represent the two selected symbols, and to allocate the new symbol a frequency based on the two selected symbols;

the list generator further being configured in operation to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols from all available entries in the first and the second list.

19. A computer program product on a computer readable medium for operating a data processing system to generate a structured listing of symbols from which encoded data values for those symbols can be determined, the computer program product comprising:

a list generator configured in operation to generate from an input stream of symbols a first list having a plurality of entries, each entry identifying a symbol in the input stream and the frequency with which that symbol appears;

a sorter configured in operation to order the entries in the first list by frequency;

a selector configured in operation to select the two symbols having the lowest frequency;

a new symbol generator configured in operation to be responsive to the selector to generate a new symbol to represent the two selected symbols, and to allocate the new symbol a frequency based on the two selected symbols;

the list generator further being configured in operation to generate a second list for storage of new symbols generated by the new symbol generator, the list generator being arranged to store the new symbol as an entry in the second list along with an indication of the frequency allocated to the new symbol, the list generator further being arranged to make unavailable for subsequent steps in the generation of the structured listing the entries for the two symbols selected by the selector; and the selector and new symbol generator being arranged to repetitively represent the two symbols having the lowest frequency with a new symbol until only one available entry remains, each new symbol being stored in the second list, and in each iteration the selector being arranged to select the two symbols from all available entries in the first and the second list.

* * * * *